US006175902B1

(12) United States Patent
Runaldue et al.

(10) Patent No.: US 6,175,902 B1
(45) Date of Patent: Jan. 16, 2001

(54) METHOD AND APPARATUS FOR MAINTAINING A TIME ORDER BY PHYSICAL ORDERING IN A MEMORY

(75) Inventors: Thomas J. Runaldue, San Jose; Bahadir Erimli, Mountain View, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 08/992,925

(22) Filed: Dec. 18, 1997

Related U.S. Application Data

(60) Provisional application No. 60/038,025, filed on Feb. 14, 1997.

(51) Int. Cl.[7] .................................................. G06F 12/00
(52) U.S. Cl. ........................... 711/159; 711/128; 370/230
(58) Field of Search ..................................... 711/159, 160, 711/157, 205–209, 128; 370/230, 349, 382, 355, 356

(56) References Cited

U.S. PATENT DOCUMENTS

| | | | |
|---|---|---|---|
| 4,980,816 | * 12/1990 | Fukuzawa et al. ................... | 711/207 |
| 5,155,831 | * 10/1992 | Emma et al. .......................... | 711/118 |
| 5,226,125 | * 7/1993 | Balmer et al. ........................ | 710/132 |
| 5,256,958 | * 10/1993 | Eng et al. .............................. | 370/389 |
| 5,440,546 | * 8/1995 | Bianchini, Jr. et al. .............. | 370/413 |
| 5,515,376 | 5/1996 | Murthy et al. . | |
| 5,590,122 | * 12/1996 | Sandorfi et al. ...................... | 370/394 |
| 5,842,224 | * 11/1998 | Fenner .................................. | 711/202 |
| 5,953,335 | * 9/1999 | Erimli et al. .......................... | 370/390 |

FOREIGN PATENT DOCUMENTS

| | | |
|---|---|---|
| 0 622 922 A1 | 11/1994 | (EP) . |
| 2 624 994 | 6/1989 | (FR) . |
| 2 107 092 | 4/1983 | (GB) . |

OTHER PUBLICATIONS

Kenneth J. Schultz et al., "Cam–Based Single–Chip Shared Buffer ATM Switch", Supercomm/ICC, New Orleans, May 1–5, vol. 2, Institute of Electrical and Electronics Engineers, 1994, pp. 1190–1195.

* cited by examiner

Primary Examiner—John W. Cabeca
Assistant Examiner—Pierre-Michel Bataille

(57) ABSTRACT

A method and arrangement for maintaining a time order of entries in a memory determines a row in which the entry will be stored, the memory being logically divided into rows and columns. The columns are arranged sequentially in each row from the newest to the oldest. Once the row in which the entry will be stored is determined, the entry is stored in that row in the column (or entry location) that is the newest column. The entry that was previously in the newest column is shifted to the next older column, and the entry that was previously in the next older column is shifted to the next most older column, etc. If a row is completely filled prior to the writing of a new entry, then the entry in the oldest column is removed from the memory and the other entries shifted.

13 Claims, 9 Drawing Sheets

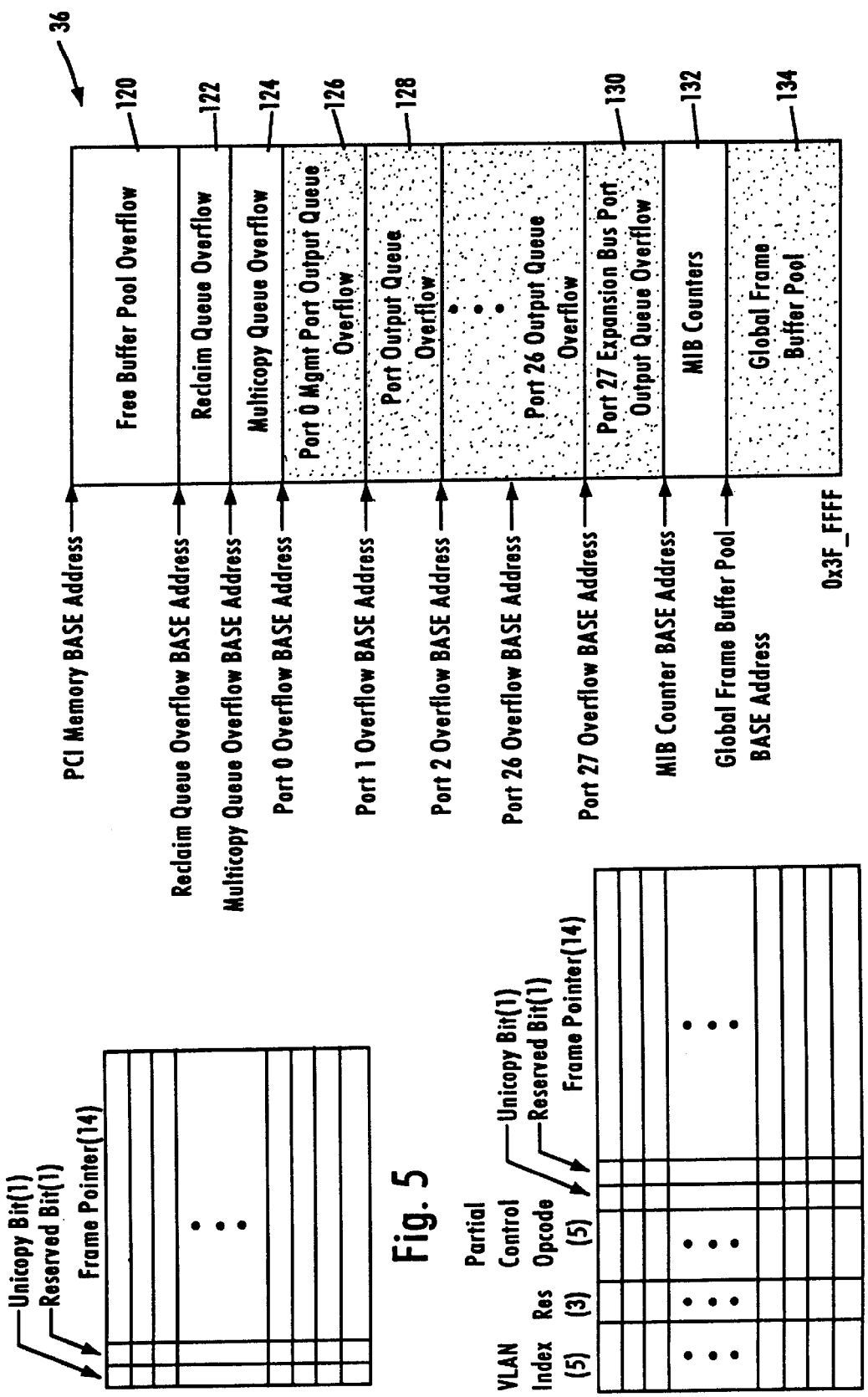

METHOD AND APPARATUS FOR MAINTAINING A TIME ORDER BY PHYSICAL ORDERING IN A MEMORY

RELATED APPLICATIONS

This application claims priority from provisional application Ser. No. 60/038,025, filed Feb. 14, 1997, entitled "INTEGRATED MULTIPORT SWITCH", which is incorporated herein by reference.

FIELD OF THE INVENTION

The present invention relates to the field of data storage, and more particularly, to method and apparatus for maintaining a time order of entries in a memory.

BACKGROUND ART

There are many circumstances in which it is desirable to age entries stored in a memory. Aging memory entries permits a memory to be kept relatively small, since older entries that have not been accessed for some time can be removed to make room for new entries. This aging is useful in a cache memory, for example, in which speed of access and searching for entries is a normal requirement. Such caches are used in many types of systems, such as computers, network switches for packet switched networks, etc. To keep a cache memory small and therefore fast and readily searchable, only the entries that are most likely to be accessed should be kept in the cache memory at any one time, and these are typically the most recent entries into the cache memory.

A conventional arrangement for aging memory entries employs time stamping of the entries in the memory. Time stamping involves encoding and associating a "time stamp" with an entry. This time stamp is decoded by the memory manager in order to determine the relative ages of the entries in the memory, and allow the memory manager to remove old entries in favor of newer entries.

The time stamping procedure and arrangements in the prior art require additional overhead and structure, and may slow down a memory due to the time it takes to perform the time stamping procedures. A similar problem in memories is that of determining the validity of entries. Again, in order to keep cache memories as small as practical, it is normally important to remove invalid entries from the cache memory in order to provide room for new, valid entries. Typically, an entry will be provided with a valid bit, which indicates the validity of that entry. A memory manager will examine these valid bits in the cache when accessing an entry in the memory to determine if the accessed entry in the memory is valid. This separately provided valid bit adds to the size of the cache and the complexity of the memory arrangement.

SUMMARY OF THE INVENTION

There is a need for a memory arrangement and a method of maintaining a time order of entries in a memory that does not employ additional bits dedicated to time stamps or validity bits.

This and other needs are met by the present invention which provides a memory arrangement for storing entries in a memory and maintaining a time order of the entries, comprising an n-way set associative memory divided into m rows and n columns. Each row contains n entry locations and each entry location stores a separate entry. The entry locations in each row are ordered from a newest to an oldest entry location. A manager stores an entry in the memory by writing the entry into the newest entry location in the row, and shifting each entry previously in a newer entry location into the next older entry location in the row.

The above-described embodiment of the invention does not require time stamps as the entries are aged (i.e., time order of the entries is maintained) by a physical reordering of the entries in the memory. The use of a single row to store multiple entries, and writing them in the row in order, and shifting that order and writing a new entry into the newest entry location, maintains the order (ages) of entries as they are written into the memory. Time stamps are not required, as the relative physical position of an entry within a row indicates the relative age of that entry with respect to the other entries in that row.

Another embodiment of the invention also satisfies the earlier stated needs and provides a network switch for a packet switched network, the switch being able to transmit multiple copies of a single frame of received data. The switch has a multicopy queue configured to queue entries, each entry containing a frame pointer that points to a location at which a frame is stored and a copy number that indicates the number of copies to be transmitted. A memory arrangement is provided for storing entries exiting the multicopy queue that have a positive copy number and maintaining a time order of these entries. The memory arrangement includes an n-way set associative memory divided into m rows and n columns, each row containing n entry locations, each entry location configured to store a separate entry, with the n entry locations in each row being ordered from a newest to an oldest entry location. The manager is configured to store entries in the memory by writing the entry into the newest entry location in the row, and shifting each entry previously in a newer entry location into the next older entry location in the row.

The network switch of the present invention employs a memory arrangement that orders the entries by physically reordering the entries in the memory. This avoids the use of time stamp structure in the cache and allows the cache to be kept smaller, a critical consideration in devices such as network switches, in which space on the chip is at a premium. The less on-chip space devoted to memory, the smaller the chip and/or the more functionality can be placed on the chip. Also, in certain embodiment of the network switch of the present invention, the validity of an entry is encoded within the entry itself. For example, the copy number is used as an encoded validity indication in certain embodiments. A null copy number means in a stored entry that the entry in the memory is not valid. The encoding of the validity avoids the need for a separate validity bit for each entry, and further reduces the complication and size of the memory arrangement.

The earlier stated needs are also met by another embodiment of the present invention which provides a method of maintaining a time order of entries in a memory, comprising the steps of logically dividing a memory into rows and columns, with each column within a row providing storage for a different entry, with the columns within a row arranged sequentially from a column that stores a newest entry to a column that stores an oldest entry. A new entry received at the memory and the row in which the entry will be stored is then determined. Each entry currently stored in a row is reordered from a newer column to the next older column in the row. If an entry originally is stored in the oldest column in the row prior to the reordering, that entry is removed from the row. The new entry is then written in the newest column in the determined row.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 5 is a detail of a first type of output queue in accordance with an embodiment of the present invention.

FIG. 6 is a detail of a second type of output queue in accordance with an embodiment of the present invention.

FIG. 7 is a detail of an overflow area of the external memory, configured in accordance with an embodiment of the present invention.

DETAILED DESCRIPTION OF ILLUSTRATIVE EMBODIMENTS

The present invention will be described with the example of a switch in a packet switched network, such as an Ethernet (IEEE 802.3) network. It will become apparent, however, that the present invention is also applicable to other packet switched systems, as described in detail below, as well as to other types of systems in general.

Figure 1:
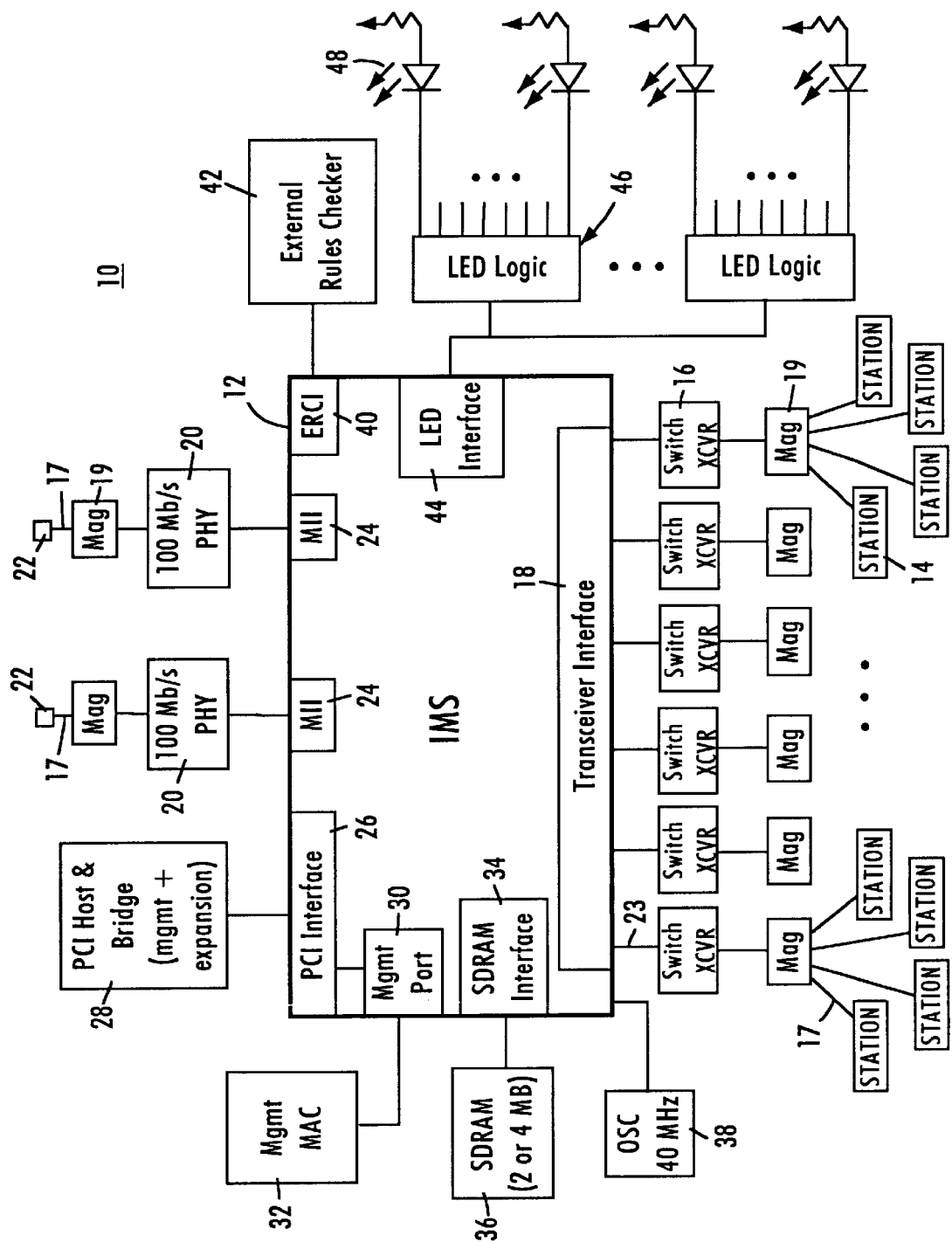
FIG. 1 is a block diagram of a packet switched system constructed in accordance with an embodiment of the present invention.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mbps) network stations 14 that send and receive data at a network data rate of 10 Mbps, and two 100 Mbps network stations 22 that send and receive data packets at a network speed of 100 Mbps. Hence, the switch 12 selectively forwards data packets received from the network stations 14 or 22 to the appropriate destination based upon Ethernet protocol.

According to the disclosed embodiment, the 10 Mbps network stations 14 send and receive data packets to and from the switch 12 via a media 17 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 17. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mbps network stations 22 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mbps network station 22 and the switch 12, where the switch 12 and the respective stations 22 can simultaneously transmit and receive data packets without collisions. The 100 Mbps network stations 22 each are coupled to network media 17 via 100 Mbps physical (PHY) devices 20 of type 100 Base-TX, 100 Base-T4, or 100 Base-FX. The switch 12 includes a media independent interface (MII) 24 that provides a connection to the physical devices 20. The 100 Mbps network stations 22 may be implemented as servers or routers for connection to other networks.

As shown in FIG. 1, the network 10 includes a series of switch transceivers 16 that perform time division multiplexing and time division demultiplexing for data packets transmitted between the switch 12 and the 10 Mbps stations 14. A magnetic transformer module 19 maintains the signal waveform shapes on the media 17. The switch 12 includes a transceiver interface 18 that transmits and receives data packets to and from each switch transceiver 16 using a time-division multiplexed protocol across a single serial non-return to zero (NRZ) interface 23. The switch transceiver 16 receives packets from the serial NRZ interface 23, demultiplexes the received packets, and outputs the packets to the appropriate end station 14 via the network media 17. According to the disclosed embodiment, each switch transceiver 16 has four independent 10 Mbps twisted-pair ports and uses 4:1 multiplexing across the serial NRZ interface enabling a four-fold reduction in the number of pins required by the switch 12.

The switch 12 contains a decision making engine, switching engine, buffer memory interface, configuration/control/status registers, management counters, and MAC (media access control) protocol interface to support the routing of data packets between the Ethernet ports serving the network stations 14 and 22. The switch 12 also includes enhanced functionality to make intelligent switching decisions, and to provide statistical network information in the form of management information base (MIB) objects to an external management entity, described below. The switch 12 also includes interfaces to enable external storage of packet data and switching logic in order to minimize the chip size of the switch 12. For example, the switch 12 includes a synchronous dynamic RAM (SDRAM) interface 34 that provides access to an external memory 36 for storage of received frame data, memory structures, and MIB counter information. The memory 36 may be an 80, 100 or 120 MHz synchronous DRAM having a memory size of 2 or 4 Mbytes.

The switch 12 also includes a management port 30 that enables an external management entity to control overall operations of the switch 12 by a management MAC interface 32. The switch 12 also includes a PCI interface 26 enabling access by the management entity via a PCI host and bridge 28. Alternatively, the PCI host and bridge 28 may serve as an expansion bus for a plurality of switch devices 12.

The switch 12 includes an internal decision making engine (FIG. 2) that selectively transmits data packets received from one source to one, many, or no destination stations. The internal decision making engine may be substituted with an external rules checker. The switch 12 includes an external rules checker interface (ERCI) 40 that allows use of an external rules checker 42 to make frame forwarding decisions in place of the internal decision making engine. Hence, frame forwarding decisions can be made either by the internal rules checker or the external rules checker 42.

The switch 12 also includes an LED interface 44 that clocks out the status of conditions per port and drives LED external logic 46. The LED external logic 46, in turn, drives LED display elements 48 that are human readable. An oscillator 38 provides a 40 MHz clock input for the system functions of the switch 12.

Figure 2:
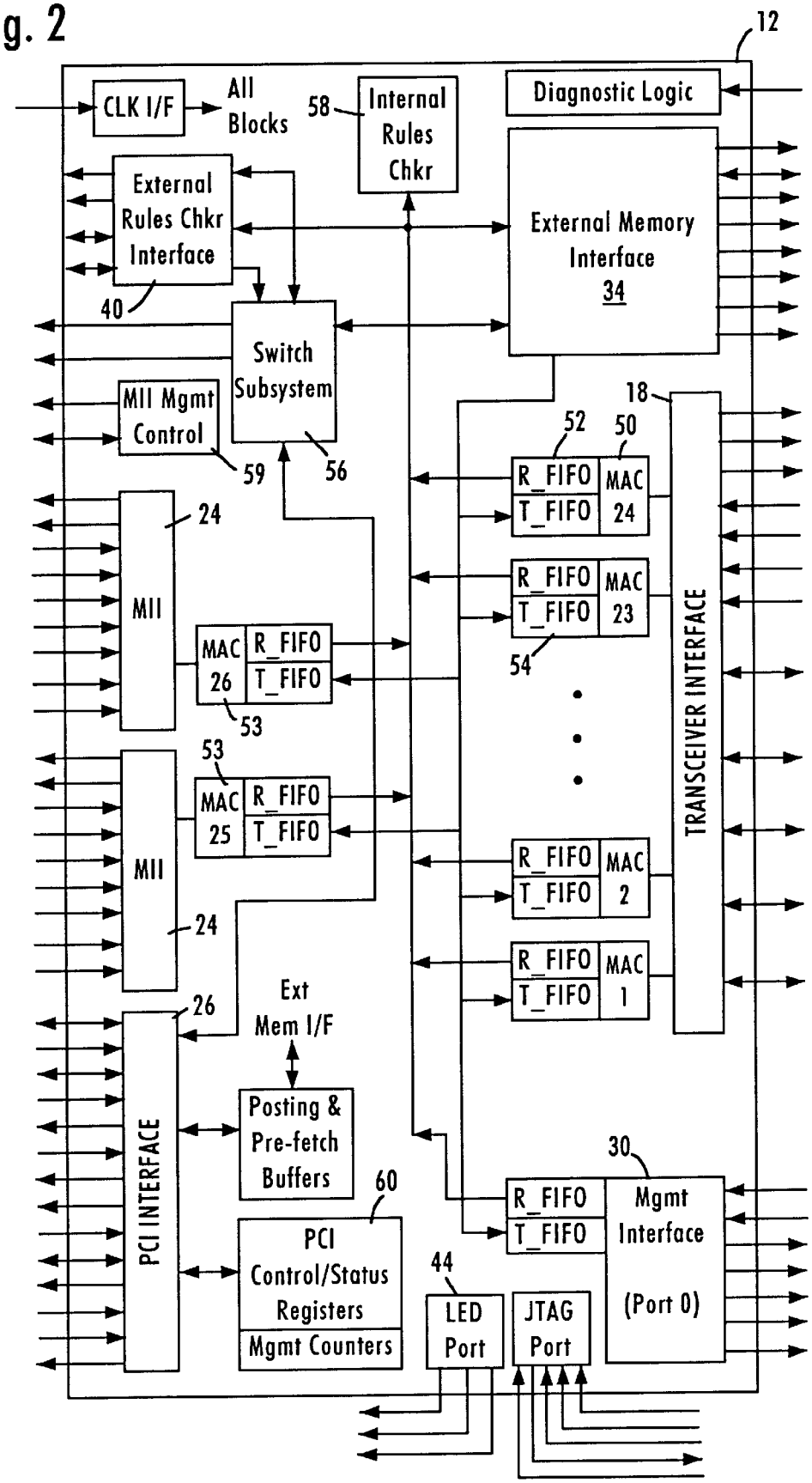
FIG. 2 is a block diagram of a multiport switch constructed in accordance with an embodiment of the present invention and used in the packet switched system of FIG. 1.

FIG. 2 is a block diagram of the integrated multiport switch (IMS) 12 of FIG. 1. The switch 12 includes twenty-four (24) 10 M\bps media access control (MAC) ports 50 for sending and receiving data packets in half-duplex between the respective 10 Mbps network stations 14 (ports 1–24), and two 100 Mbps MAC ports 53 for sending and receiving data packets in full-duplex between the respective 100 M\bps network stations (ports 25, 26). As described above, the management interface 30 (port 0) also operates according to MAC layer protocol. Each of the MAC ports 50, 53 and 30 has a receive first in-first out (FIFO) buffer 52 and transmit FIFO 54. Data packets from a network station are received by the corresponding MAC port and stored in the corresponding receive FIFO 52. The received data packet is output from the corresponding receive FIFO 52 to the external memory interface 34 for storage in the external memory 36.

The header of the received packet is also forwarded to a decision making engine, either internal rules checker 58 or the external rules checker interface 40, to determine which MAC ports will output the data packet. Specifically, the packet header is forwarded to the internal rules checker 58 or the external rules checker interface 40, depending on whether the switch 12 is configured to operate using the internal rules checker 58 or the external rules checker 42. The internal rules checker 58 and external rules checker 42 provide the decision making logic for determining the destination MAC port for a given data packet. The decision making engine may thus output a given data packet to either a single port, all ports (i.e., broadcast), or no ports (i.e., filtering). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mbps stations 22) or a prescribed group of stations. Hence, either the internal rules checker 58 or the external rules checker 42 via the interface 40 will decide whether a frame temporarily stored in the buffer memory 36 should be output to a single MAC port or multiple MAC ports.

Use of the external rules checker 42 provides advantages such as increased capacity, a random-based ordering in the decision queue, and enables decisions to be made in an order independent from the order in which the frames were received by the switch 12 and decision making based on a larger amount of data from the beginning of the frame (up to 64 bytes).

The decision making engine (i.e., internal rules checker 58 or the external rules checker 42) outputs a forwarding decision to a switch subsystem 56 in the form of a port vector identifying each MAC port that should receive the data packet. The port vector from the rules checker includes the address location storing the data packet in the external memory 36, and the identification of the MAC ports to receive the data packet for transmission (e.g., MAC ports 0–26). The switch subsystem 56 fetches the data packet identified in the port vector from the external memory 36 via the external memory interface 34, and supplies the retrieved data packet to the appropriate transmit FIFO 54 of the identified ports.

Additional interfaces provide management and control information. For example, a management data interface 59 enables the switch 12 to exchange control and status information with the switch transceivers 16 and the 100 Mbps physical devices 20 according to the MII management specification (IEEE 802.3u). For example, the management data interface 59 outputs a management data clock (MDC) providing a timing reference on the bidirectional management data IO (MDIO) signal path.

The PCI interface 26 is a 32-bit PCI revision 2.1 compliant slave interface for access by the PCI host processor 28 to internal IMS status and configuration registers 60, and access external memory 36. The PCI interface 26 can also serve as an expansion bus for multiple switch devices. The management port 30 interfaces to an external MAC engine through a standard seven-wire inverted serial GPSI interface, enabling a host controller access to the switch 12 via a standard MAC layer protocol.

Figure 3:
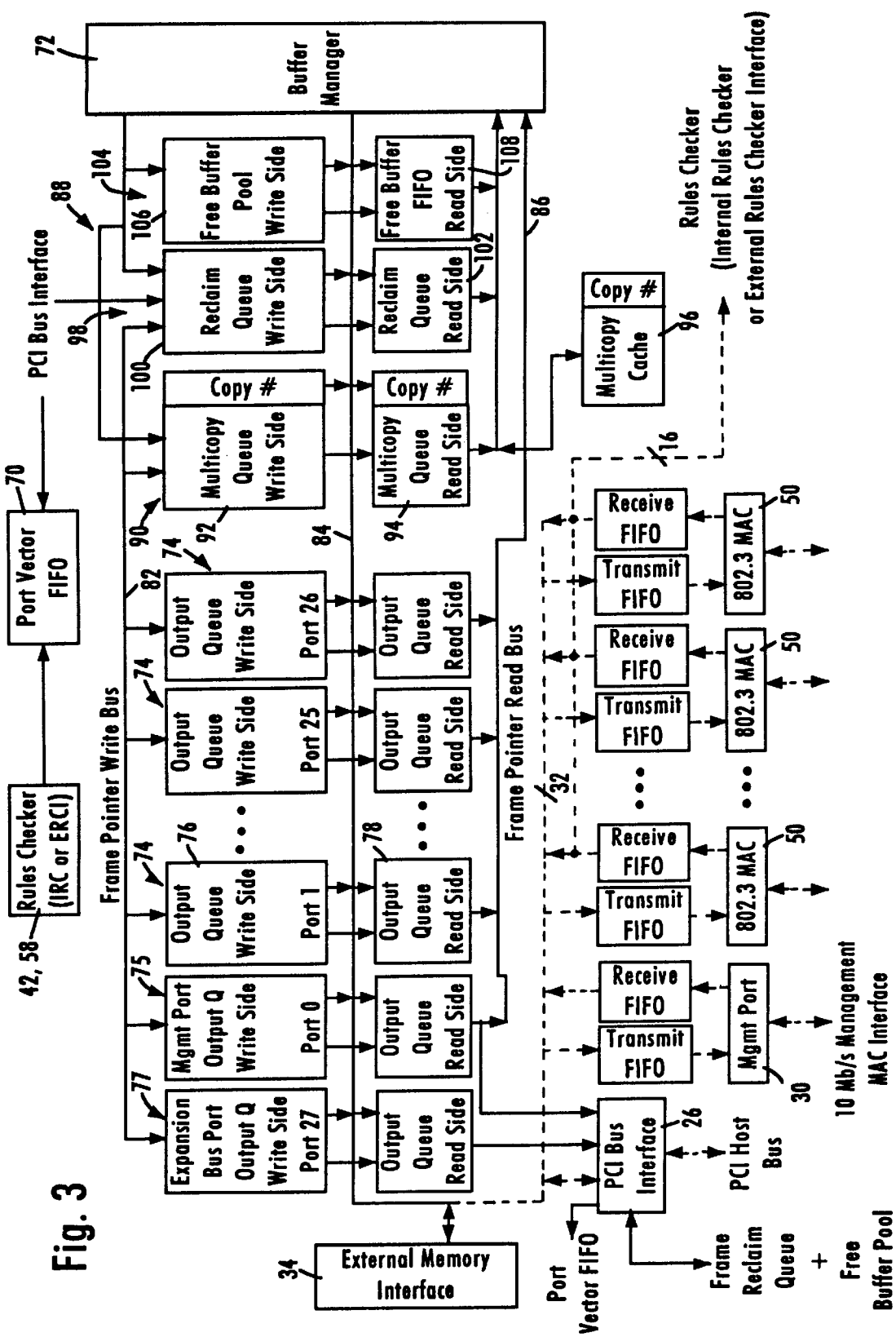
FIG. 3 is a schematic depiction of a switch subsystem of the multiport switch of FIG. 2, constructed in accordance with an embodiment of the present invention.

FIG. 3 depicts the switch subsystem 56 of FIG. 2 in more detail according to an exemplary embodiment of the present invention. Other elements of the multiport switch 12 of FIG. 2 are reproduced in FIG. 3 to illustrate the connections of the switch subsystem 56 to these other elements. The switch subsystem 56 contains the core switching engine for receiving and forwarding frames. The main functional blocks used to implement the switching engine include: a port vector FIFO 70, a buffer manager 72, a plurality of port output queues 74, a management port output queue 75, an expansion bus port output queue 77, a free buffer pool 104, a multicopy queue 90, a multicopy cache 96 and a reclaim queue 98. The operation and structure of these functional blocks will be described in more detail, but a brief overview of the switch subsystem 56 of FIG. 3 is first presented to provide context to the later discussion of the individual elements.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a separate MAC 50, having its own receive FIFO 52 and transmit FIFO 54.

Frames, whether unicopy or multicopy, are received by the internal MAC engines 50. When the frame packet is received at the port, it is placed in the receive FIFO 52. Each frame has a header, which is provided to a rules checker, either the internal rules checker 58 or the external rules checker 42. The rules checker 42 or 58, based on the information in the header (or in the case of 42, up to 64 bytes of data from the frame) determines from where the frame packet will be cast, i.e., through which port or ports will the frame packet be transmitted.

Before the rules checker 42 or 58 get the data necessary for forwarding decision, the buffer manager 72 obtains a free buffer pointer from the free buffer pool 104. This free buffer pointer is the location in external memory 36 at which the frame will be stored by the receive FIFO 52. Once the free buffer pointer is obtained from the free buffer pool 104 by the buffer manager 72, the buffer pointed to by the free buffer pointer is no longer considered free. The frame data is transferred over data bus 80 from the receive FIFO 52 to the external memory 36 in a direct memory access (DMA) transaction. The frame is stored in the location pointed to by the free buffer pointer obtained from the free buffer pool 104, although a number of other buffers may be used to store a frame, as will be described.

In addition to the header data, the rules checker 42 or 58 also receives the free buffer pointer from the buffer manager 72. This free buffer pointer is now referred to as a frame pointer since it points to the memory location in the external memory 36 where the frame is stored. The rules checker 42 or 58 uses the header information to make the forwarding decision and generate a forwarding instruction in the form of a "port vector". In the exemplary illustrated embodiment, the port vector is a 28-bit vector with a bit set for each output port to which the frame should be forwarded. Assume for this overview example that the received frame is a unicopy frame. Accordingly, only one bit is set in the port vector generated by the rules checker 42 or 58. The bit that is set in the port vector corresponds to a particular one of the ports.

The rules checker 42 or 58 places the port vector and the frame pointer (as well as a control opcode and a VLAN index in the case of 100 Mbps ports, management port and PCI port) into the port vector FIFO 70. The port vector is examined by the port vector FIFO 70 to determines into which particular output queue 74 (or queues) the frame pointer associated with the port vector should be input. The port vector FIFO 70 places the frame pointer into the top of the appropriate output queue 74. This queues the transmission of the frame.

At some point in time, the frame pointer reaches the bottom of the output queue 74 after passing through the output queue 74. The buffer manager 72 takes the frame pointer when it arrives at the bottom of the output queue 74 and passes the frame pointer to the appropriate transmit FIFO 54 of the correct port via frame pointer read bus 86. This schedules the transmission of the frame. The frame data is read in a DMA transaction from the location in external memory 36 pointed to by the frame pointer, is placed in the appropriate transmit FIFO 54 and then transmitted.

A multicopy transmission is similar to the unicopy transmission, except that the port vector has multiple bits set, designating the multiple ports from which the frame will be transmitted. The frame pointer is placed into each of the appropriate output queues 74 and transmitted from the corresponding transmit FIFOs 54.

The buffer manager 72 uses the special control queues, i.e., the free buffer pool 104, the multicopy queue 90, and the reclaim queue 98, and the multicopy cache 96 to manage the process of allocating buffers to store received frames and retrieving buffers for re-use once the frame has been transmitted to its designated output port(s). The buffer manager 72 also maintains "overflow" regions in external memory 36 for the output queues 74 and the control queues 104, 90 and 98, as will be described in more detail later.

With this operational overview serving as background, the individual sections and various aspects of the switch subsystem 56 will now be discussed in more detail. The first of these aspects that will be described is the structure of the various output queues 74 of the present invention. In addition to the output queues 74 designated for the 10 Mb/s output ports and the 100 Mb/s output ports, an output queue 75 is provided for the management port 30, and an output queue 77 is provided for the expansion port 26. These output queues 75, 77 have the same external structure as the output queues 74, but different internal configurations, as will be described.

Figure 4:
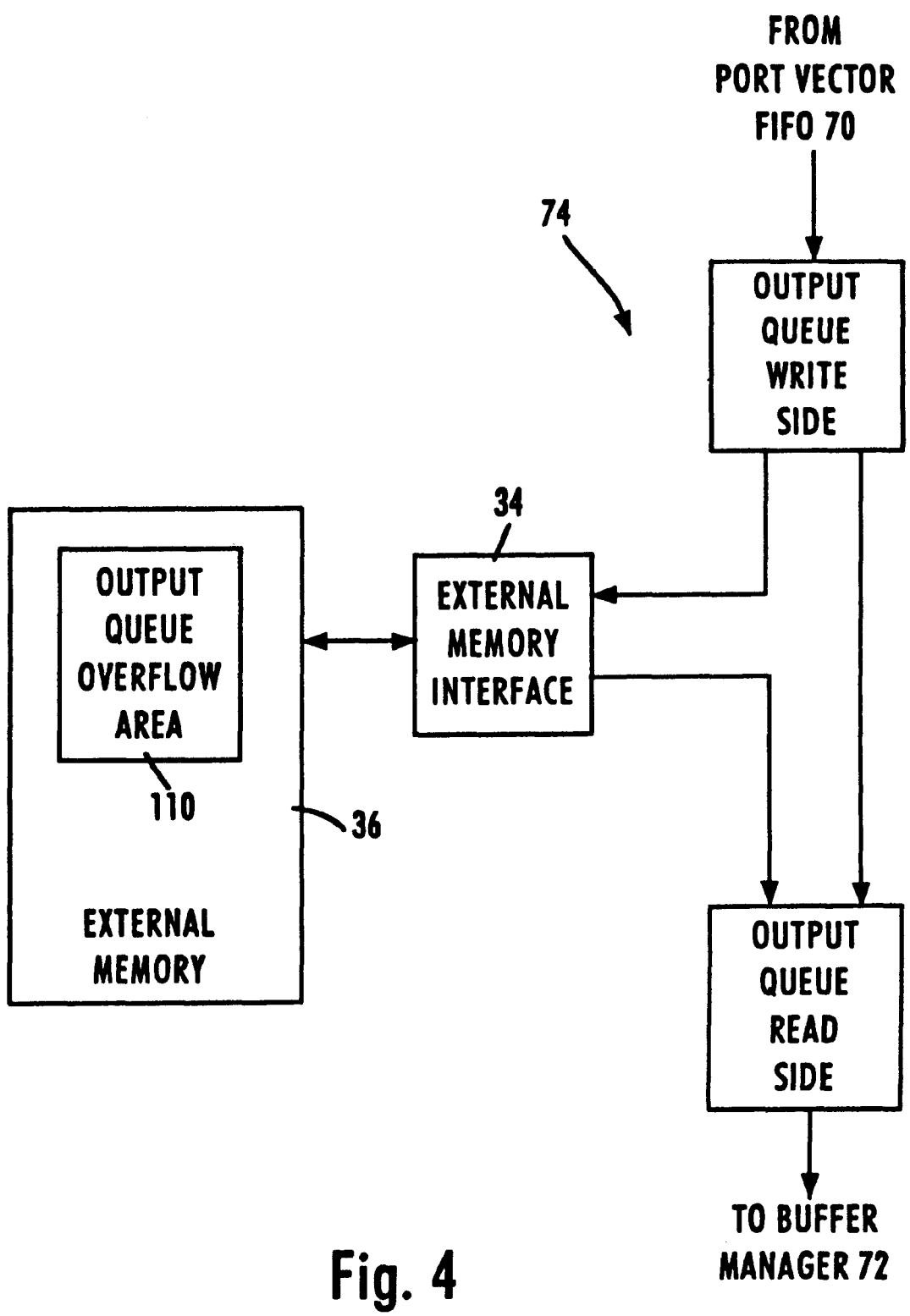
FIG. 4 is a block diagram of a single output queue of the switch subsystem of FIG. 3, constructed in accordance with an embodiment of the present invention.

FIG. 4 is a block diagram of the external structure of an output queue 74 in accordance with an embodiment of the present invention. As is apparent from FIG. 4, the output queue 74 of the present invention has a three-part configuration. For highest performance it is preferable to keep all of the queuing structure on the chip (referring to the multiport switch 12), but the real estate on a chip is very expensive. This presents a dilemma when the chip is designed to switch, and needs to queue, a large number of entries. The present invention solves this dilemma by providing a single output queue that includes a high performance, low capacity section that is on-chip, and an overflow area that is off-chip. The overflow area allows the queue to serve as a large capacity queue as needed, albeit with a relatively lower performance than the on-chip portion.

A single logical output queue 74 of the present invention, according to the embodiment of FIG. 4, has three physical sections. These include an output queue write side 76, an output queue read side 78, and an output queue overflow area (generally designated as 110) located in the external memory 36. Access to the external memory 36 for all of the output queues 74 is through the external memory interface 34, as described earlier. The present invention takes advantage of the bursting nature of current external memories, so that the data (e.g., frame pointers) is sent on and off the chip to the overflow queue area 110 in bursts over the bus 84 connecting the chip 12 to the external memory 36.

The output queue write side 76 and the output queue read side 78 are located on the chip 12. The write side 76 and the read side 78 are considered to be small, expensive resources. By contrast, the overflow area 110, forming the third part of the output queue 74, is large and inexpensive. The write side 76 and the read side 78 provide high performance, while the path through the overflow area provides a low-performance, large capacity path.

In operation, the output queue write side 76 receives an entry. In the exemplary embodiment of a multiport switch 12 according to the present invention, the entry is a frame pointer that points to the first buffer in external memory in which the first 240 bytes of a frame are stored. It should be apparent to those of skill in the art, however, that the output queue structure 74 is not limited to frame pointers as entries, but is widely applicable to queue other types of entries, both in multiport switches and in other technologies.

After the entry flows through and reaches the bottom of the output queue write side 76, control logic associated with the output queue 74 makes a decision as to what to do with the entry. If there is space in the output queue read side 78, and the overflow area 110 for that output queue 74 is empty, then one or more entries are passed directly from the output queue write side 76 to the output queue read side. This passing of the entry or entries directly from the write side 76 to the read side 78 is performed entirely on the chip 12, and is therefore a low-latency, fast flow-through of an entry.

If the output queue read side 78 is full, and there is at least a burst-size amount of data (e.g., 16 bytes worth of entries) in the output queue write side 76, then the data is written in a burst fashion into the overflow area 110 for that output queue 74. If the output queue read side 78 is full, but there is not yet a burst-size amount of data in the output queue write side 76, then the entry remains in the output queue write side and nothing further is done. Eventually, the output queue read side 78 will empty, and when the output queue read side 78 has enough space to accommodate a burst-size amount of data, and there is data in the overflow area 110, a burst of data is provided from the overflow area 110 into the output queue read side 78.

In the output queue structure, the read side 78 is acting most like a traditional queue, because it is from this portion that entries are taken, one by one. The output queue write side 76 mostly serves a collection function to assemble the data into bursts for writing to the external memory 36. Hence, the present invention transforms single events (placing an entry into the output queue 74) into a burst event. The write side 76 allows an accumulation of data to then burst, if necessary, to the overflow area 110 in the external memory 36. The overflow area 110 provides inexpensive storage in times of congestion, rather than dedicating expensive chip resources to a function that will only be needed on relatively rare occasions. Even though the present invention utilizes an overflow area 110 that is off-chip, the accessing of this area 110 is performed in a manner that is efficient, by bursting a number of bytes of information at a time. This is in contrast to conventional queuing structures in which single entries are written and read to and from the queue.

During operation, if there is a lot of entries arriving at the output queue 74, these entries are placed into the overflow area 110 to avoid overflowing the on-chip queue 78. Hence, the discarding of frames is largely prevented with the queue structure of the present invention. Also, the total amount of memory dedicated to the overflow areas 110 may be readily changed by changing the size of the external memory 36. Furthermore, the sizes of the individual specific overflow areas 110 are programmable to customize the queue sizes, without impacting the performance of the output queues 74.

Typically, a queue is an ordered structure with a first-in, first-out arrangement. In some types of queues, however, such as the reclaim queue 98 and the free buffer pool 104, the order of entries does not matter. If it is possible to send data directly from the write side 100 to the read side 102, the present invention permits information to be directly sent this route, bypassing the overflow area for the queue. This is permitted even if there is information in the associated overflow area, as long as the information is not order-sensitive. For example, the reclamation of buffers is not order-sensitive, since any order in which the buffers are eventually returned to the free list in the free buffer pool 104 after the buffer is no longer needed to store the frame is acceptable. Hence, in order to avoid incurring the bandwidth of a write to the overflow area 110 for the reclaim queue 98 in the external memory 36 when the data is not order-sensitive, the information is passed directly from the write side 100 to the read side 102, assuming the read side 102 has room for more entries. The reclaim queue 98 is an example of a type of queue that queues data which is not order-sensitive. However, there are many other types of data in different applications that are also not order-sensitive, so that this feature of the present invention finds utility in queues that queue these other types of data.

In the multiport switch of an exemplary embodiment of the present invention as depicted in FIGS. 1 and 2, there are twenty-eight output queues (each associated with an output port): twenty-four for the 10 Mb/s user ports, two for the 100 Mb/s server ports, one for the management port and one for the expansion bus port. The output queues 74, 75 and 77 provide temporary storage for frame pointers when they are queued for transmission. Queuing takes the form of the port vector FIFO 70 writing frame pointers into the various output queues 74, 75 and 77 indicated in a forwarding port vector.

In certain preferred embodiments of the invention, the various output queues 74, 75 and 77 contain several or all of the following fields: unicopy bit, frame pointer, control opcode or control signals, and VLAN (virtual local area network) index. The unicopy bit flags a frame which is to be forwarded to only one output port. The frame pointer points to the beginning of the frame in external memory 36. The control opcode identifies special information about the address (i.e., newly learned frame, etc.). The control signals use information from the control opcode to indicate how the ports will handle frames before transmission. The VLAN index provides the reference to a VLAN tag which should be inserted (if necessary) into the outgoing frame. However, these fields are exemplary only, as the present invention is applicable to other output queues with different types of fields.

The internal structure of an exemplary embodiment of a first type of output queue 74, the 10 Mb/s port output queue, is depicted in FIG. 5. The 10 Mb/s output queues 74 hold entries for frames to be forwarded to the 10 Mb/s ports. The output queue write sides 76 for these queues hold thirty-two entries and the output queue read sides 78 hold sixteen entries in the exemplary illustrated embodiment, although other sizes are contemplated and within the scope of the invention. Each entry in a 10 Mb/s output queue 74 comprises a unicopy bit and a frame pointer (14 bits). In the exemplary embodiment of the multiport switch of the present invention, the VLAN index is not necessary because there is no VLAN tagging on 10 Mb/s ports.

The internal structure of an exemplary embodiment of a second type of output queue 74, the 100 Mb/s port output queue, is depicted in FIG. 6. The 100 Mb/s port output queues hold entries for frames to be forwarded to the 100 Mb/s ports. The output queue write side 76 holds sixty-four entries in this type of output queue, and the output queue read side holds sixteen entries. Each entry comprises a VLAN index, a partial control opcode (bits 4-0), a unicopy bit and a frame pointer.

An exemplary map of the external memory 36 is depicted in FIG. 7. The overall capacity of the external memory 36 may be, for example, 4 Mb, although other capacity memories are employed in different embodiments. The use of an external memory 36 for the overflow areas according to the present invention permits increasing or decreasing the size of the output queues by simply changing the size of the overflow area in the external memory. This is an advantage over systems in which the queue structure is entirely on the chip, as the overall queuing capacity is set at manufacture of the chip.

To satisfy the storage requirements of the switch 12, an exemplary embodiment of the external memory 36 allocates space for the following areas: free buffer pool overflow 120, reclaim queue overflow 122, multicopy queue overflow 124, management port output queue overflow 126, individual output queue overflows 128 for each of the 10 Mb/s and 100 Mb/s destination ports, expansion bus port output queue overflow 130, the MIB counters 132, and the global frame buffer pool 134.

The BASE Address for the entire memory region is programmable in a memory base address register among the registers 60 on the chip. The BASE Address for each area in the external memory map is programmable in the register set. No length register is required, the length for a given area being equal to the area from that area's BASE Address to the BASE Address of the next area in the mapping.

Since the length (and therefore capacity) of each of the individual overflow areas is programmable, the overall capacity of each queue is programmable. This feature of the present invention permits customization of the switch to provide particular output queues with increased capacity, as needed.

The following overflow areas store entries that do not fit into the control queues on the chip 12 are therefore placed into the external memory 36. The free buffer pool overflow area 120 stores the address pointers to currently unused buffers in the global frame buffer pool 134. The reclaim queue overflow area 122 stores frame pointers to linked-list chains that are no longer needed. The multicopy queue overflow area 124 stores frame pointers with copy numbers ">=1" (for queued frame pointers) and frame pointers with copy numbers "-1" (for successfully transmitted frames) The following overflow areas store entries for output queues which do not fit on-chip. The management port output queue overflow area 126 stores frame pointers awaiting transmission to the management port. Output queue overflow areas 128 store frame pointers awaiting transmission to the appropriate 10 Mb/s port or 100 Mb/s port. The expansion bus port output queue overflow area 130 stores frame pointers awaiting transmission to the expansion bus port.

The MIB counter region 132 contains all the per port statistics which are updated periodically by the switch 12. The switch 12 maintains 8-bit and 16-bit counters on-chip for storing MIB statistics. The switch 12 updates the 32-bit or 64-bit MIB counters in external memory 36 with the frequency required to prevent loss of MIB data.

The global frame buffer pool 134 contains buffers in linked-lists which store received frame data. At any given time, these linked lists contain valid frame data, obsolete buffers which will be returned by the buffer manager 72 to the free buffer pool 104 or are owned by the PCI host processor 28.

Figure 8:
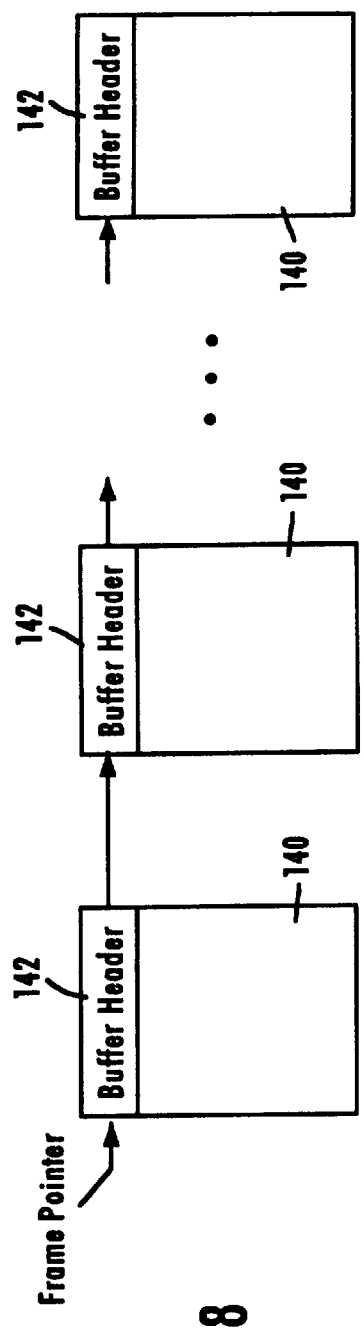
FIG. 8 is a block diagram of a linked list data structure employed in the present invention.

Referring now to FIG. 8, frame data received from any MAC port or the PCI bus is stored in external memory 36 in a linked-list data structure format in an exemplary embodiment of the present invention. The buffers 140 used to create the linked-list are 256 bytes in length, although other sized buffer lengths are employed in different embodiments of the invention. Address pointers to each of these buffers 140 are stored by the free buffer pool 104 in the switch 12.

As a frame is received at one of the ports of the switch 12, the buffer manager 72 requests address pointers from the free buffer pool 104 for linking buffers 140 to store the frame. The address pointer to the first buffer in external memory 36 that stores the frame becomes the frame pointer for that frame. The frame pointer is used in the switch subsystem 56 for queuing frames to be transmitted.

The buffers 140 are chained together by address pointers in each buffer header 142 that indicate the location of the next buffer in memory. The buffer headers 142 also contain other information about the frame data contained in the buffer 140. The first buffer's header is 12 bytes, as depicted in the exemplary buffer header format of FIG. 9a. Each subsequent buffer's header is 4 bytes, as depicted in FIG. 9b. The external memory bursts are 2 banks×16-bytes long, so actual frame storage capacity in each buffer is 256B–16B= 240B.

Figure 9A:
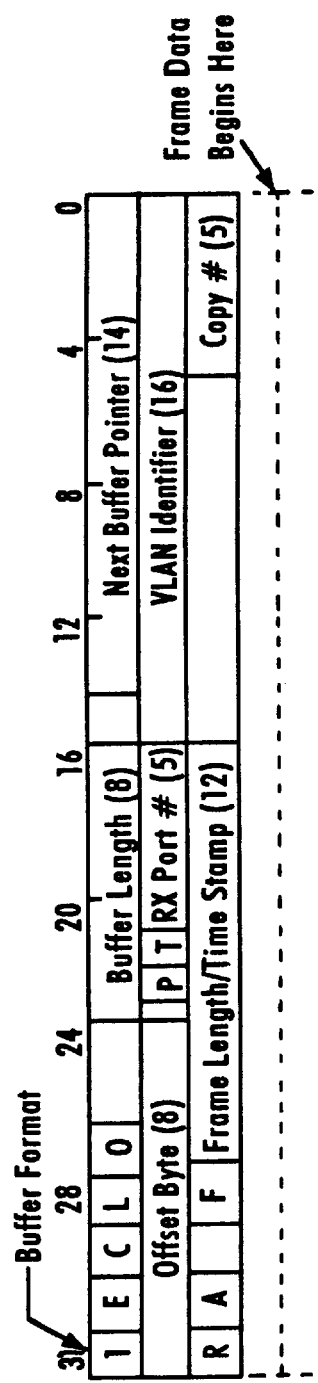
FIG. 9 schematically depicts a frame buffer header format in accordance with an embodiment of the present invention.
Figure 9B:
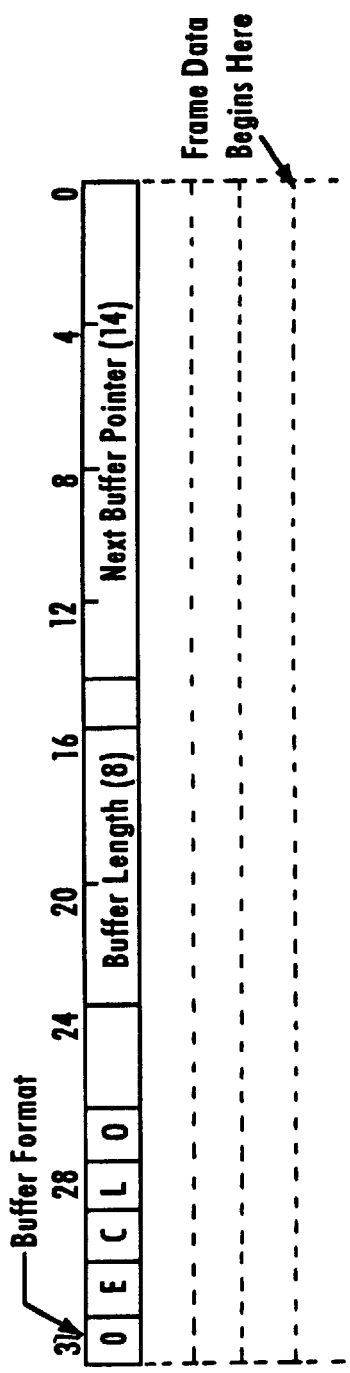

As depicted in FIGS. 9a and 9b, the first and subsequent buffer header formats contain the following fields:

Buffer Format Bit: indicates what buffer format is in use. A one indicates the first buffer's format, which is 12 bytes in length. A zero indicates a subsequent buffer's format, which is 4 bytes. It is used for each of the remaining buffers when chaining buffers.

E Bit (End of Frame Marker): indicates this is the last buffer for a frame. When the E bit is set, there are no more buffers in the chain.

C Bit (CRC Error Detected): indicates a CRC error was detected by the receiver. When the C Bit is detected, the transmit function will purposely transmit an inverted CRC.

L Bit (Alignment Error): indicates a Frame Alignment Error was detected (along with a CRC Error) in the receive frame.

O Bit (Receive FIFO Overflow): indicates the receive FIFO overflowed and the data in the buffer may not be valid.

Buffer Length: the total number of bytes which are valid in the data field of the buffer beginning with the first byte after the buffer header. This length should not include the Offset Byte value.

Next Buffer Pointer: the pointer to the next buffer. The next buffer pointer is not valid when the E Bit is set.

Offset Byte Count: indicates where the first byte of the frame starts in the frame data section of the buffer. An offset of zero means the data will begin at the first byte after the buffer header 142. An offset of zero indicates frame data will begin at the byte following the $16^{th}$ byte in the buffer. For non-zero values of offset, frame data will begin following 16B+Offset from the beginning of the buffer. The transmit function will skip over the number of bytes indicated in the offset Byte field.

P Bit (Port Type): indicates the port type of the incoming receive frame. A zero indicates a 10 Mb/s port and a one indicates a 100 Mb/s port. This bit is used by the host 28 in conjunction with the time stamp field when it programs the switch 12 to forward frames to the expansion bus before the frame is completely received and buffered to external memory 36.

T Bit: indicates the received frame type: tagged or untagged. A one indicates a tagged frame and the VLAN Identifier field contains the received VLAN ID. A zero indicates an untagged frame and the VLAN ID is not valid.

Receive Port Number: the number of the port from which the frame was received.

VLAN Identifier: the VLAN ID received from a "tagged" port. If the frame was received from an untagged port, this field is invalid.

R Bit (Recalculate CRC): indicates the CRC needs to be stripped and recalculated at the transmit function. The switch 12 sets this bit when a tagged frame is received. In addition, if the host 28 modifies a frame's contents, the host 28 should set this bit. When the switch 12 transmits a frame, it will examine this bit to determine whether to transmit the existing CRC or strip and recalculate the CRC.

A Bit (Append CRC): indicates that there is no CRC at the end of the frame data. The host can create a frame in memory (without a CRC) then set this bit. The switch 12 will generate and append a CRC when transmitting the frame. If the A Bit is set, the frame length should not include CRC.

F Bit (Format Bit): identifies the Frame Length/Time Stamp field. A zero indicates the field is the time stamp of the incoming frame. A one indicates the field is the frame length of the received frame.

Frame length/time stamp: dependent on F Bit. IF F Bit is cleared, this field represents the time stamp from the beginning of the received frame. The time stamp has a resolution of 1 $\mu$s. If the F Bit is set, indicates the total length of the received frame including CRC and any received VLAN Tag. When a frame is received, the switch 12 marks this field with the time stamp (from the timer register). If the host 28 has programmed the switch 12 to forward expansion bus frames before the frame has been completely received, it can use the time stamp (along with the speed of the receive port) to gauge how much data it can fetch from external memory 36 without over-reading the frame data. Once the entire frame has been received, the switch 12 writes the frame length into this field and sets the F Bit.

Copy number: used to indicate the number of copies successfully queued for transmission by the port vector FIFO 70. This field is used to store the copy number for a frame pointer if the buffer manager 72 needs to make space in the multicopy cache 96 for new entries.

Figure 10:
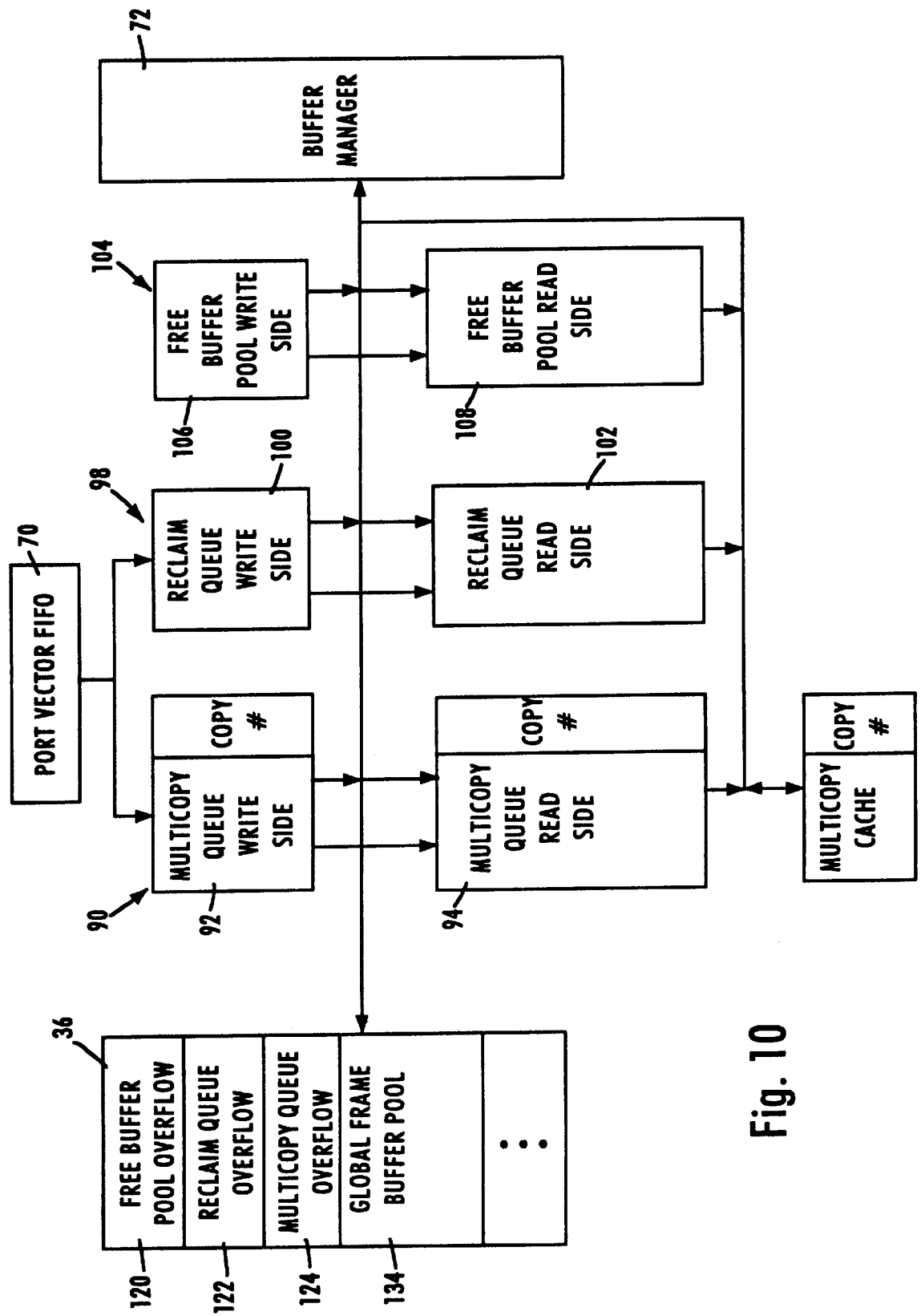
FIG. 10 is a detail of the multicopy, reclaim and free buffer pool area of the switch subsystem of FIG. 4, constructed in accordance with an embodiment of the present invention.

FIG. 10 is a detailed depiction of some of the elements of the switch subsystem 56 of FIG. 3. These elements are used to provide the buffers for storage of frames, and to reclaim these buffers and make them available for use again once the buffers are no longer needed for storage of the frame. As described earlier, each output queue 74, 75 (except output queue 77) passes frame pointers to the buffer manager 72, which schedules transmission of the frames pointed to by the frame pointers. The buffer manager 72 controls the following functions: 1) managing the internal busses of the switch 12; 2) facilitating queuing/dequeuing frame pointers to/from the output queues 74; 3) managing the control queues 90, 98 in order to locate and return buffers to the free buffer pool 104; 4) controlling the flow of data to and from the external memory 36; and 5) maintaining the memory structures, including MIBs and overflow areas. The buffer manager 72 contains a scheduler function for allocating all accesses to external memory 36. These accesses include 1) writing received frame data to memory buffers 140, 2) reading frame data from memory buffers 140 for transmission and 3) maintaining (i.e., writing and reading) the frame pointers in each of the overflow areas for the output queues 74 and control queues 90, 98 and 104) updating MIB counters.

After the buffer manager 72 has copied a given frame pointer to all the appropriate output queue(s) 74, 75, the port vector FIFO 70 calculates the number of copies (the "copy number"). The copy number may be "0", indicating that the frame should not be forwarded, a "1", indicating a unicopy transmission, or a number ">1", indicating a multicopy transmission. These three cases are described below.

When the copy number is "0", which means that the frame pointer has a null forwarding port vector with no bits set, the port vector FIFO 70 passes the frame pointer directly to the write side 100 of the reclaim queue 98. When the buffer manager 72 services the reclaim queue 98, as will be described, the buffer manager 72 breaks down the linked-list chain of buffers and returns the address pointer for each "free" buffer to the write side 106 of the free buffer pool 104.

When the copy number is "1", a unicopy transmission, the port vector FIFO 70 copies the frame pointer, control signals/control opcode and the VLAN index to the output queue 74 of the appropriate port. The port vector FIFO 70 sets the unicopy bit in the output queue 74 (see FIGS. 5 and 6) to indicate that this is a single transmission. When the buffer manager 72 reads the frame pointer and the unicopy bit from the output queue 74 of the port, it schedules the transmission as discussed previously. The buffer manager 72 uses the frame pointer to locate the first buffer in external memory 36 in which the frame is stored. The buffer manager 72 reads the buffer header from this first buffer, captures data from the first buffer and places this data in the appropriate MAC transmit FIFO 54. The links to subsequent buffers, assuming that the frame spans multiple buffers, provides the buffer manager 72 with the address to find and transmit all of the buffers in the chain for that frame. Once the data has been placed in the FIFO 54 for transmission, the buffer becomes obsolete and is returned to the free buffer pool 104 for eventual re-assignment to store data of another frame.

When the copy number is greater than 1, the port vector FIFO 70 copies the frame pointer, VLAN index and control signals/control opcode to each of the appropriate output queues 74. (When referring to queues 74, reference is also made to queues 75, 77). The port vector FIFO 70 clears the unicopy bit for the appropriate frame pointers in the output queues 74 and places the frame pointer with a copy number of ">1" into the write side 92 of the multicopy queue 90.

Whenever the buffer manager 72 reads a frame pointer and a cleared unicopy bit from one of the output queues 74, the buffer manager 72 schedules the transmission of the frame, but also checks the multicopy cache 96 for an entry with a frame pointer having a copy number of "1". If a frame pointer with a copy number of "1" is found in the multicopy cache 96, then the buffer manager 72 schedules the frame for transmission and reclaims the buffers during transmission in the same manner as in the unicopy transmission of a frame. However, if the frame pointer is not in the multicopy cache 96 or the copy number of the frame pointer in the multicopy cache 96 is greater than 1, then the buffer manager 72 transmits the frame but does not reclaim the buffers. After successful transmission, the buffer manager 72 places a copy of the frame pointer, along with a copy number of "−1" into the write side 92 of the multicopy queue 90.

Each time a multicopy frame is transmitted, the buffer manager 72 places a copy of the frame pointer into the multicopy queue 90, provided the buffer manager 72 did not find the frame pointer in the multicopy cache 96 with a copy number of "1". Hence, at any given time, the multicopy queue 90 may contain the frame pointer with a copy number that is >"1" and/or several copies of the same frame pointer, each with a copy number of −1.

The buffer manager 72 constantly services the multicopy queue 90 and the multicopy cache 96 in order to reclaim obsolete buffers. When it services the multicopy queue 90 and reads a frame pointer with a copy number ">1", the buffer manager 72 attempts to place this new entry (frame pointer and copy number) into the multicopy cache 96. If the multicopy cache 96 is full, the buffer manager 72 makes space for the new frame pointer. The buffer manager 72 reads an "older" multicopy cache entry, updates the copy number for this entry in its buffer header in external memory 36, then clears the entry from the multicopy cache 96. As room becomes available in the multicopy cache 96, the buffer manager 72 is able to place the new entry from the multicopy queue 90 into the multicopy cache 96.

When the buffer manager 72 services the multicopy queue 90 and reads a frame pointer with a copy number of "−1", it searches the multicopy cache 96, looking for a matching frame pointer address with a copy number ">=1" to decrement or delete. If the buffer manager 72 finds a frame pointer match, the buffer manager 72 will: 1) decrement the multicopy cache's frame pointer if the copy number is ">1" or 2) delete the multicopy cache's frame pointer/copy number entry and place the frame pointer into the reclaim queue 98 if the copy number is "1".

If the buffer manager 72 does not find a matching frame pointer, the buffer manager 72 searches the frame pointer's buffer header in external memory 36 (see FIG. 9) for the copy number. If the copy number in memory is "1", the buffer manager 72 places the frame pointer into the reclaim queue 98. If the copy number in memory is ">1", the buffer manager 72 decrements the copy number, then places the frame pointer with this copy number into the multicopy cache 96.

The buffer manager 72 constantly services the reclaim queue 98 by reading frame pointers, then "walking" the linked-list chain to return buffers to the free buffer pool 104. This activity only returns buffers for frames that had null port vectors and were queued to the reclaim queue by the port vector FIFO 70, or frames with a multicopy forwarding vector and have completed transmissions of all of the copies. Buffers linked for unicopy frames are returned directly to the free buffer pool 104 when the frame is transmitted, as described above.

If the port vector FIFO 70 is not able to place a frame pointer for a unicopy forwarding vector into an output queue 74, because that output queue 74 and its overflow area 110 in external memory 36 are full, the frame is discarded. The frame pointer is returned to the reclaim queue 98 and the discarding of the frame is noted by the management resources of the switch. If the port vector FIFO 70 is not able to place one or more frame pointers for a multicopy forwarding vector, because one or more of the output queues 74 and their overflow areas 110 in external memory 36 are full, the frame is only forwarded to the output queues with available space and the copy number placed into the multicopy queue 90 will only reflect the successfully placed frame pointers. The non-placement of the frame pointer is noted by the switch management resources for each of the ports for which the frame pointer could not be queued. If the port vector FIFO 70 is not able to place any of the frame pointers for a multicopy forwarding vector, because all of the output queues 74 and their overflow areas 110 in external memory 36 are full, the frame pointer is passed to the reclaim queue 98, and the switch management resources are duly notified.

Figures 11, 12, 13:
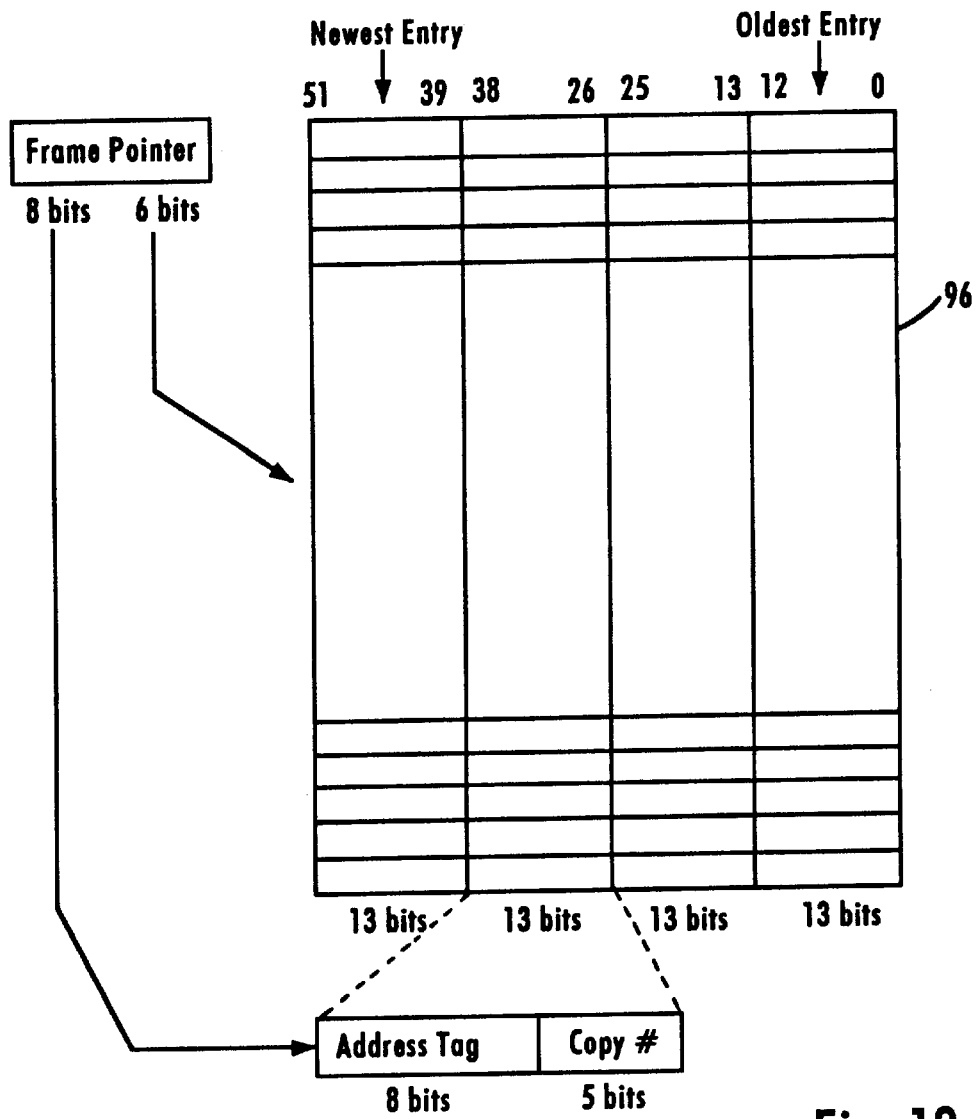
FIG. 11 is block diagram of a free buffer pool structure constructed in accordance with an embodiment of the present invention.
FIG. 12 is a block diagram of a multicopy queue configured in accordance with an embodiment of the present invention.
FIG. 13 is a schematic representation of the multicopy cache constructed in accordance with an embodiment of the present invention.

The multicopy queue 90 is a high priority queue used by the buffer manager 72 to keep track of how many transmissions must be completed of a particular multicopy frame before all buffers (i.e., address pointers) used to store the frame can be returned to the free buffer pool 104. The write side 92 and read side 94 of this output queue hold 64 and 16 entries, respectively. The multicopy queue 90 feeds the multicopy cache 96, which is used by the buffer manager 72 to determine when to reclaim buffers. The multicopy queue internal structure is depicted in FIG. 12.

The port vector FIFO 70 places a copy of a frame's frame pointer and copy number which is ">1", based on the number of frame pointers it successfully placed in the output queues 74, into the multicopy queue 90. If a particular port's output queue 74 is full, the port vector FIFO 70 cannot place a copy of the frame pointer into the output queue 74; hence it cannot include this as a successful event in determining the copy number.

Each time the buffer manager 72 reads an output queue frame pointer and finds the unicopy bit is "0", (i.e., a multicopy), it checks the multicopy cache for the frame pointer with a copy number of "1", which indicates that this is the last transmission. If this match is found, the buffer manager 72 transmits the frame and reclaims the buffers in the same manner as in the unicopy transmission, by providing the obsolete buffers to the free buffer pool 104 after the transmission of the contents of each buffer. If the match is not found, the buffer manager 72 transmits the multicopy frame and places a copy of the frame pointer with a copy number of "−1" into the multicopy queue 90. When a host has finished using a multicopy frame pointer for a frame which was queued to the expansion bus output queue 75 or the management port output queue 77 (through the PCI interface 26), the host writes a copy of the frame pointer with a copy number of "−1" into the multicopy queue through a frame pointer register. This register is one of the registers depicted in the block of registers 60 in FIG. 2.

Similar to the output queues 74, the multicopy queue 90 is structured with an input path and an output path. The input path, or write side, allows the port vector FIFO 70 and buffer manager to place frame pointers/copy numbers into the multicopy queue 90. The output path, or read side, allows the multicopy queue 90 to place frame pointers/copy numbers into the multicopy cache 96. Additional storage for frame pointers/copy numbers, termed the multicopy queue overflow 124, is provided in external memory 36.

When frame pointers/copy numbers are written into an empty multicopy queue 90, they pass from the write side 92 to the read side 94 until the read side 94 is full. Additional frame pointers/copy numbers written to the write side 92 of the multicopy queue 90 are placed into the multicopy queue overflow area 124 in external memory 36. Once the read side 94 of the multicopy queue 90 and its overflow area 124 are full, additional frame pointers/copy numbers placed into the multicopy queue begin to fill the write side 92.

The ordering of the frame pointers passing through the multicopy queue 90 is maintained, such that when space clears in the multicopy queue read side 94, frame pointers/copy numbers are moved from the multicopy queue overflow area 124 to the multicopy queue read side 94 and from the multicopy queue write side 92 to the multicopy overflow area 124.

The multicopy cache 96 is similar to the multicopy queue 90 but provides a searchable region for scanning frame pointers/copy numbers. The multicopy cache 96 holds up to 256 entries. The buffer manager 72 reads a frame pointer from the multicopy queue 90 and either places it into the multicopy cache 96 or processes it, depending on whether the copy number is ">1" or "−1".

In addition, each time the buffer manager 72 reads a frame pointer from the read side 78 of an output queue 74, the buffer manager 72 schedules the transmission. If the unicopy bit is "0" (meaning a multicopy frame), the buffer manager 72 scans the multicopy cache 96 for the frame pointer with a copy number of "1", which indicates this is the last transmission of this frame. If there is a match, the buffer manager 72 removes the entry and returns buffers to the free buffer pool during frame transmission. If there is not a match, the buffer manager 72 places the frame pointer with a copy number of "−1" into the multicopy queue 90 upon completion of the transmission.

Periodically, the buffer manager 72 services the multicopy queue 90 by reading a frame pointer/copy number and placing it into the multicopy cache 96 or processing it. This is done independently of frame transmission. Two cases follow depending on whether the buffer manager reads a frame pointer with a copy number ">1" or "−1":

1) The buffer manager 72 reads a frame pointer with a copy number ">1" from the multicopy queue 90. Provided there is room in the multicopy cache 96, it writes a new entry. If the multicopy cache 96 is full, the buffer manager 72 must clear space in the cache 96. This is done by reading one of the older frame pointer/copy numbers from the multicopy cache 96, updating that frame pointer's buffer header in external memory 36 with the copy number in the multicopy cache 96, then deleting this cache entry. Once there is space, the new frame pointer/copy number is written into the multicopy cache 96.

2) The buffer manager 72 reads a frame pointer with a copy number "−1" from the multicopy queue 90. The buffer manager 72 searches the multicopy cache 96 for a matching frame pointer with a copy number ">=1". Two cases follow, depending on whether or not the buffer manager 72 finds a frame pointer match in the multicopy cache 96:

a) The buffer manager 72 finds a frame pointer match. If the multicopy cache 96 entry's copy number is "1", the buffer manager 72 deletes the multicopy cache entry and places the frame pointer in the reclaim queue 98. If the cache entry's copy number is ">1", the buffer manager 72 decrements the copy number by "1".

b) The buffer manager 72 does not find a frame pointer match in the multicopy cache 96. This means that the matching frame has previously been moved to the buffer header of the frame's linked-list chain in external memory 36. The buffer manager 72 must go to the buffer header and read the copy number. If this value (in memory) is "1", the frame is no longer needed and the buffer manager 72 places the frame pointer in the reclaim queue 98. If this value (in memory) is ">1", the buffer manager 72 decrements the copy number (that was in external memory 36), then places it into the multicopy cache 96. If the multicopy cache 96 is full, the buffer manager clears space by moving one of the older frame pointer/copy numbers into external memory 36.

The reclaim queue 98 holds the frame pointers to the linked-list chains which are no longer needed. The buffer manager 72 writes a frame pointer to the reclaim queue when it services the multicopy cache and discovers that a frame pointer's copy number is "1" (i.e., the last transmission of the frame has completed successfully). Additionally, the port vector FIFO 70 writes frame pointers to the reclaim queue 98 under the following conditions: 1) a frame pointer's port vector is null or 2) the frame pointer could not be queued because all of the forwarding vector's output queues were full. Finally, the host writes a frame pointer to the reclaim queue 98 (using a frame pointer register) when it has finished using a unicopy frame which was queued to the expansion bus output queue 77 or the management port output queue 75.

When the buffer manager 72 processes reclaim queue entries, it walks a frame pointer's linked-list chain to return each buffer to the free buffer pool 104. The internal structure of the reclaim queue structure is not depicted, but contains only the frame pointers (14 bits) in the exemplary embodiment of the invention. The reclaim queue write side 100 holds 64 entries and the reclaim queue write side 102 side holds 16 entries.

Similar to the output queues 74, the reclaim queue 98 is structured with an input path and an output path. The input path, or write side 100, allows the buffer manager 72 to place frame pointers in the reclaim queue 98. The output path, or read side 102, allows the buffer manager 72 to read a frame pointer and return all associated buffers to the free buffer pool 104. Additional storage for frame pointers is provided in the reclaim queue overflow area 122 provided in external memory 36.

When frame pointers are written into an empty reclaim queue 98, they pass from the write side 100 to the read side 102 until the read side 102 is full. Additional frame pointers written to the write side 100 of the reclaim queue 98 are placed into the reclaim queue overflow area 122 in external memory 36. Once the read side 102 and overflow area 122 of the reclaim queue 98 are full, additional frame pointers placed into the reclaim queue 98 begin to fill the write side 100.

FIG. 11 depicts an exemplary embodiment of the internal structure of the free buffer pool 104. The free buffer pool 104 is a FIFO that contains address pointers to all free buffers 140 in external memory 36. When frames are received, the buffer manager 72 captures available address pointers from the free buffer pool 104 to store incoming data. The buffer manager 72 also allocates address pointers from the free buffer pool 104 to the host processor 28 (when requested). The host can request or return address pointers to the free buffer pool 104 by reading or writing a free buffer pool register among the registers 60 in direct input/output space. The write side 106 and the read side 108 of the free buffer pool 104 each holds 64 entries in an exemplary embodiment of the invention.

The free buffer pool 104 is structured with an input path and an output path (similar to the output queues 74). The input path, or write side 106, allows the buffer manager 72 or host 28 to place address pointers into the free buffer pool 104. The output path, or read side 108 of the free buffer pool 104 allows the buffer manager 72 to provide address pointers to the host 28 or pull address pointers from the pool 104 for storing receive frame data. Additional storage for available address pointers, the free buffer pool overflow area 120, is provided in external memory 36, as described earlier.

Upon start-up of the switch 12, the free buffer pool generates address pointers from the read side 108. As frames come in, the free list in the free buffer pool 104 is read. If there are not enough buffer pointers in the write side 106 to handle the traffic demands, the overflow area 120 is accessed to obtain more buffer pointers.

Certain embodiments of the present invention provide an advantageous arrangement and method of providing the buffer pointers upon start-up of the switch 12. When the switch 12 first powers up, it is not required for the overflow area 120 in external memory 36 to contain buffer pointers. Instead, the buffer pointers are created on the fly. The switch 12 on power up could generate and place into the overflow area 120 the buffer pointers, but there may be 16,000 or 32,000 such pointers, and this would slow up the powering on procedure of the switch 12. The present invention takes advantage of the fact that on power up, all of the buffers are free, and the identities of these buffers are known. Therefore, the buffer pointers are generated as they are needed after power up, using a counter 180, as depicted in FIG. 10.

The free list count generator 180 is connected to the input of a multiplexer 182. Since the free list in the free buffer pool 104 is empty on startup, the free list counter 180 generates the buffer pointers. Once the free list reaches the highest count, it will not generate any more buffer pointers.

When a frame packet is received in the switch 12, the frame packet is broken up into fixed length buffers. Typically, frames vary in size. The buffers are 256 bytes in size and the data portion of a buffer is 240 bytes. Following transmission of the frame, the frame pointer is put into reclaim queue 98 or, in the case of an unicopy frame the individual buffer pointer in the linked list are put, directly into the free list of the free buffer pool 104. During operation of the switch 12, any address pointers returned to the free buffer pool 104 pass from the write side 106 to the read side 108. If the read side 108 becomes full, additional address pointers are passed to the overflow area 120. Once the read side 108 and the overflow area 120 are full, additional address pointers placed into the free buffer pool 104 will begin to fill the write side 106 of the pool 104 again.

FIG. 13 depicts a schematic representation of the internal arrangement of the multicopy cache 96 in accordance with an embodiment of the present invention. As briefly discussed earlier, the time order of the entries to the multicopy cache 96 is maintained. In the present invention, this maintaining of a time order is not done by time stamping, as in the prior art, but by physical ordering in a memory. The multicopy cache 96 of the present invention also avoids the use of validity bits, and instead encodes validity, as will be discussed.

Referring to FIG. 13, the multicopy cache 96 is configured as a four-way set-associative memory. An entry into the multicopy cache 96 includes a frame pointer and its copy number, as explained earlier. The lowest six bits of the frame pointer determine the row in the set-associative cache 96 in which the entry will be stored. In the illustrated embodiment of the invention, there are sixty-four rows in the cache 96, although other numbers of rows are not limited if the cache size is made larger.

The set-associative cache 96 is divided into four columns, each of which can be searched in parallel. When the buffer manager 72 stores an entry into the cache 96, the entry always enters the first column, the uppermost (51:39) bits of the row indicated by the six least significant bits of the frame pointer. The row is read, all of the entries are shifted to the right by 13 bits, and the row is written back. The entry that is actually written into the cache 96 includes the upper eight bits of the frame pointer that form an address tag, and the five-bit copy number associated with the frame pointer. When the entry is read out of the cache 96, the frame pointer is re-formed with the address tag and the bits that index the row number of the cache 96.

The oldest entry in the cache 96 is removed from the cache 96 if the row is full and a new entry to the row is written. As described earlier with respect to the buffer headers 142, the copy number associated with the frame pointer that is removed is written into the buffer header 142 of the frame in external memory pointed to by the removed frame pointer. Hence, the frames (i.e., the buffers 140) stored in external memory 36 serve as an overflow area for the multicopy cache 96 to store copy numbers.

One of the advantageous features of the present invention is that there is no separate valid bit in the set-associative cache 96. When the copy number is 00000, then the buffer manager 72 knows that the entry is no longer valid and removes the entry from the cache 96. This simplifies the organization of the cache. Another advantage of the cache 96 of the present invention is that it allows a very fast search to be performed, since the buffer manager 72 needs only to examine a single row, already determined by the frame pointer that has exited the multicopy queue 90. The four entries in the row are examined in parallel, further increasing the speed of the search. Although described as a four-way set-associative memory, this is exemplary only as the memory can be n-way set-associative without departing from the scope of the invention.

From the above description, it should be understood that the present invention maintains a time order (age) of the cache entries by physical positioning of the entries in the cache on a row basis. In other words, the physical position of the entry in the cache is an indication of the relative age of an entry. The aging of an entry is performed by the physical re-ordering of the entries in the memory.

Figure 14:
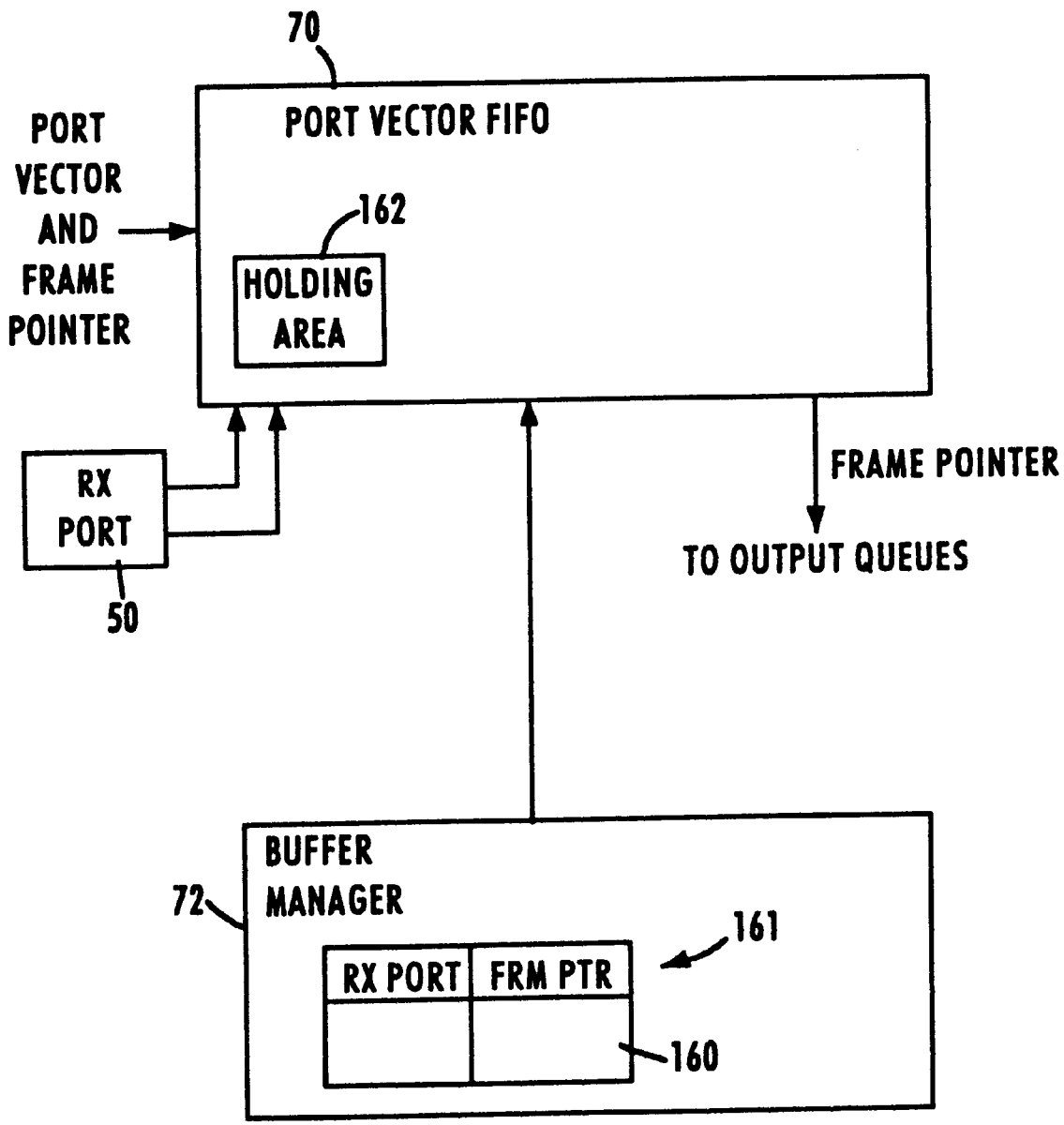
FIG. 14 is a block diagram of a queuing block of the buffer manager of the switch subsystem and a port vector FIFO, constructed in accordance with an embodiment of the present invention.

Certain embodiments of the present invention provide customization of the latency of frames switched by the switch 12, on a port by port basis. Referring to FIG. 14, the port vector FIFO 70 examines the programmed switch mode of the receive port to determine when to place the frame pointer and associated information into the appropriate output queue 74 of the transmit port. For a first mode (low latency mode), the port vector FIFO 70 has no restrictions on when to place the frame pointer into the output queue(s) 74. For a second mode (intermediate latency mode), the port vector FIFO 70 places the frame pointer into the output queue(s) 74 only after 64 bytes of the frame have been received. For a third mode (high latency mode), the port vector FIFO 70 places the frame pointer into the output queue(s) 70 only after the frame has been completely received.

There are some special cases which alter the timing of when the port vector FIFO 70 passes frame pointers to the output queues 74: 1) frames forwarding from a first or second mode 10 Mb/s port to a 100 Mb/s port; 2) frames forwarding to the management port 30 and 3) frames forwarding to the expansion bus port. In case 1), the 10 Mb/s port to 100 Mb/s port rate mismatch forces the forwarding mode to be the third, high latency mode. In case 2), all frames passed to the management port are third mode frames. In case 3), any frame forwarding to the expansion bus port uses the switch mode of the expansion bus port 26. When a multicopy port vector contains one of the special case ports, the queuing of the frame pointers for the entire port vector becomes that of the longest latency switch mode represented in the port vector. For example, if a frame is received by a first or a second mode port, but its multicopy forwarding port vector contains the management port 30, the switch mode is the third mode. In this situation, a copy of the frame pointer is placed into all the output queues 74 only after the frame has been completely received.

The switch modes will now be described in more detail. The switch mode that applies to the input (i.e., receive) port determines forwarding latency (how soon the switch 12 will forward a frame once it begins receiving the frame) and the ability to reduce fragment/error propagation to output ports. The second, intermediate latency mode is the default for each port; however, the switch mode is programmable on a per-port basis in the registers 60.

In all of the three modes, frame data received at the receive FIFO 52 of an internal MAC port is forwarded to a buffer 140 in the external memory 52 as soon as possible. At approximately the same time, the rules checker 42 or 58, receives the destination address and source address, the receive port number, the frame pointer and some additional information, then performs the appropriate lookup. Once the lookup is completed, the rules checker 42 or 58 returns the frame pointer and the forwarding port vector to the port vector FIFO 70.

The port vector FIFO 70 places the frame pointer in the write side 76 of the output queues 74 for the output port(s) identified in the port vector. The receive port's switch mode defines the latency between when the port vector FIFO 70 receives the port vector (and the frame pointer) and places the frame pointer into the output queue(s) 74. This is described for the three modes below. Once the frame pointer passes to the read side 78 of the output queues 74, the buffer manager 72 reads the frame pointer and schedules transmission. The buffer manager 72 begins moving frame data from the address specified by the frame pointer. Once the transmit FIFO 54 of the MAC port has been primed to its start point (and assuming the medium is available for transmission of data), frame transmission commences.

The first mode is designed to provide the lowest latency. Frames are received and forwarded at line-rate speed. In this first mode, there is no network error protection because a frame is queued for transmission before it can be determined whether the frame is a fragment (i.e., <64 bytes in length) or contains a CRC error. In the first mode, frame reception may not complete before frame transmission at the output port(s) commences. If a receive frame terminates in a runt or with an invalid CRC, the receive MAC marks the buffer header 142 in external memory 36 to indicate these conditions. The transmit MAC guarantees that if transmission commences on a frame which later terminates as a runt or with an invalid CRC, the MAC will generate a bad CRC. If the transmit MAC has not started a frame's transmission and the buffer header 142 indicates the frame terminated in a runt or an invalid CRC, the buffer manager 72 will not forward the frame to the output port.

The second mode provides low latency for forwarding frames and some network error protection. Frames are received and forwarded after sixty-four or more bytes have been received. This allows the switch 12 to filter (i.e., not forward) fragments of frame; however, it does not completely filter CRC error frames that are greater than sixty-four bytes.

In the second mode, frame pointers for frames which achieve the sixty-four byte threshold at the receive MAC are queued to the appropriate output queue(s) 74. Frames which fail to achieve the minimum sixty-four byte threshold are deleted and their frame pointers are not placed in output queue(s) 74. If a receive frame greater than or equal to sixty-four bytes terminates with an invalid CRC, the receive MAC marks the buffer header 142 in external memory 36 to indicate this condition. If transmission has commenced on a frame greater than or equal to sixty-four bytes which later terminates with an invalid CRC, the transmit MAC will complete the transmission with a bad CRC. If the transmit MAC has not started a frame transmission and the buffer header 142 indicates the frame (greater than or equal to sixty-four bytes) terminated in an invalid CRC, the buffer manager 72 returns the frame pointer to the reclaim queue 98 (for a unicopy forward) or the multicopy queue 96 (for a multicopy forward) without forwarding to the output port(s) 74.

The third mode is a store-and-forward mode that provides the highest level of network error protection among the three modes, but has a higher forwarding latency. Frames are completely received before the switch 12 forwarding them to output ports. In this mode, the switch 12 screens out all fragments and CRC error frames before forwarding. In the third mode, once a valid frame completes successfully at the receiver (i.e., greater than or equal to sixty-four bytes with a valid CRC), the frame pointer is queued to the appropriate output queue(s) 74. Frames which terminate in a receive error (invalid CRC, runt (>64 bytes) etc.) are deleted and their frame pointers are not placed in output queue(s) 74.

The port vector FIFO 70 makes the decision to put the port vector into an output queue 74, in dependence on the selected mode of the receive port and the amount of data that has been received. In the embodiment described above, there are three thresholds, although there are different numbers of thresholds in other embodiments. In the exemplary embodiment, these thresholds are: 1) receiving n bytes (e.g. 6 bytes) where n<64 bytes; 2) receiving 64 bytes; and 3) receiving all of the frame.

The present invention forwards frames to the output queues 74 based on thresholds. The port vector FIFO 70 re-orders the sequence of transmission based on amount of type of data received and the mode in which the port is programmed. Although the exemplary embodiment makes forwarding decisions based on the amount of received data, other embodiments of the invention make forwarding decisions based on other factors, such as the types of data received.

In implementing the forwarding scheme of the present invention, the buffer manager 72 maintains a table 160 in a content addressable memory (CAM) 161 that associates a frame pointer with a receive port. Every time the port vector FIFO 70 receives a new port vector and frame pointer from the rules checker 42 or 58, it makes an association to determine whether the receive port has finished receiving a frame, and if not, how much of the frame has already been received. The port vector FIFO 70 does not receive any information regarding the identity of the receive port from the rules checker 42 or 58. The only information the port vector receives that provides any identification of the port are the frame pointers.

The port vector FIFO 70 queries the address table 160 with the frame pointer. Either the address table returns the receive port if the frame is still being received, or the address table 160 cannot find the frame pointer which means that the frame has already been received. Once the frame is completely received, the frame pointer is moved out of the address table 160. This means that the third threshold (the frame complete) is met. Accordingly, the frame pointer may be dropped into the output queue 74 immediately.

If the address table 160 returns the receive port, the port vector FIFO 70 puts the frame pointer and associated information into a holding area 162 and begins monitoring two signals from that receive port. These two signals flag one of three events. The first event is flagged when the port receives n bytes. At that point, if that port is in the first mode, the port vector FIFO 70 starts processing the frame pointer by sending it to the appropriate output queue 74. If the receive port is not in the first mode, the port vector FIFO 70 waits until it receives the a signal indicating occurrence of the second event. If this port is in the second mode, then the port vector FIFO 70 releases the frame pointer from the holding area 162 to enter the proper output queue 74. Finally, if the receive port is in the third mode, then the port vector FIFO 70 awaits receipt of the flag indicating that the frame is complete. Every receive port (reference numeral 164 in FIG. 14) maintains this flag, and provides this information to the port vector FIFO 70. It is up to the port vector FIFO 70 to determine the port associated with the frame pointer. The port vector FIFO 70 maintains the information identifying the mode each port is in. In summary, upon receiving a frame pointer, the port vector FIFO 70 first queries the address table 160 of the buffer manager 72 to determine the receive port, determines the mode for that receive port, and then monitors the flags from that receive port and releases the frame pointer according to the mode and the flags.

The buffer manager 72 performs numerous functions in the switch 12 of the present invention. The buffer manager 72 comprises control logic and/or software to implement these functions, and is readily implemented by one of ordinary skill in the art given the description of the functions of the buffer manager 72 provided above.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A network switch for a packet switched network and which transmits multiple copies of a single frame of received data, the switch comprising:
   a multicopy queue configured to queue entries, each entry containing a frame pointer that points to a location at which a frame is stored and a copy number that indicates the number of copies to be transmitted;
   a memory arrangement for storing entries exiting the multicopy queue that have a positive copy number and maintaining a time order of the entries, including an n-way set associative memory divided into m rows and n columns, each row containing n entry locations, each entry location configured to store a separate entry, with the n entry locations in each row being ordered from a newest to an oldest entry location, each row being independently and selectively accessible in accordance with a portion of the entries to be stored, such that a subset of bits comprising an entry indicates the row in which the entry is to be stored; and a manager configured to store entries in the memory by: examining the subset of bits of an entry to determine the row in which the entry is to be stored, writing the entry into the newest entry location in the determined row, and shifting each entry previously in a newer entry location into the next older entry location in the determined row.

2. The network switch of claim 1, wherein the manager is further configured to remove the entry from the oldest entry location in the row when all of the entry locations in the row contain an entry prior to writing a new entry into the row.

3. The network switch of claim 2, wherein the n-entry locations of a row are searchable in parallel by the manager.

4. The network switch of claim 3, wherein the validity of an entry is encoded within the copy number, the manager further configured to decode the validity of an entry and remove an invalid entry from the memory.

5. The network switch of claim 4, wherein the manager is further configured, upon receiving an entry from the multicopy queue having a negative copy number, which indicates transmission of a copy of the frame pointed to by the frame pointer of the entry, decode a portion of the frame pointer and access the row in the memory corresponding to the decoded portion, and search the entry locations in the row for a frame pointer that matches the frame pointer of the entry, and decrement the copy number if the copy number is greater than one, and delete the entry if the copy number is one.

6. A memory arrangement for storing entries in a memory and maintaining a time order of the entries, comprising:
   an n-way set associative memory divided into m rows and n columns, each row containing n entry locations, each entry location configured to store a separate entry, with the n entry locations in each row being ordered from a newest to an oldest entry location, each row being independently and selectively accessible in accordance with a portion of the entries to be stored, such that a subset of bits comprising an entry indicates the row in which the entry is to be stored;
   a manager configured to store entries in the memory by: examining the subset of bits of an entry to determine the row in which the entry is to be stored, writing the entry into the newest entry location in the determined row, and shifting each entry previously in a new entry location into the next older entry location in the determined row.

7. The memory arrangement of claim 1, wherein the manager is further configured to remove the entry from the oldest entry location in the row when all of the entry locations in the row contain an entry prior to writing a new entry into the row.

8. The memory arrangement of claim 7, wherein the n-entry locations of a row are searchable in parallel by the manager.

9. The memory arrangement of claim 8, wherein the validity of an entry is encoded within the entry, the manager further configured to decode the validity of an entry and remove an invalid entry from the memory.

10. The memory arrangement of claim 9, wherein the memory arrangement is part of a network switch, and the entries comprise frame pointers and copy numbers, each frame pointer pointing to a location in memory space at which a frame of data is located, and each copy number indicating the number of copies of that frame are to be transmitted.

11. The memory arrangement of claim 10, wherein the buffer manager is further configured, upon receiving an indication of a transmission of a copy of a frame pointed to by a specific frame pointer, decode a portion of the specific frame pointer and access the row in the memory corresponding to the decoded portion, and search the entry locations in the row for a frame pointer that matches the specific frame pointer, and decrement the copy number if the copy number is greater than one, and delete the entry if the copy number is one.

12. A method of maintaining a time order of entries in a memory, comprising the steps of:
   logically dividing a memory into rows and columns, with each column within a row providing storage for a different entry, with the columns within a row arranged sequentially from a column that stores a newest entry to a column that stores an oldest entry;
   receiving a new entry at the memory and determining the row in which the entry will be stored;
   reordering each entry currently stored in a row from a newer column to the next older column in the row, and if an entry originally is stored in the oldest column in the row prior to the reordering, removing that entry from the row; and
   writing the new entry in the newest column in the determined row;

wherein the step of determining the row in which the entry will be stored includes decoding the entry to produce a row number;

wherein the decoding includes examining a specific subset of bits of the entry. the value of the subset of bits corresponding to the row of the memory in which the frame will be stored.

13. The method of claim 12, wherein each entry comprises a frame pointer and a copy number, the frame pointer pointing to a location in which a frame of data is stored, and the copy number indicating the number of copies of the frame of data are to be transmitted.

* * * * *